(12) United States Patent
Chia et al.

(10) Patent No.: US 11,756,987 B2
(45) Date of Patent: Sep. 12, 2023

(54) FERROELECTRIC TUNNEL JUNCTION DEVICES WITH DISCONTINUOUS SEED STRUCTURE AND METHODS FOR FORMING THE SAME

(71) Applicant: Taiwan Semiconductor Manufacturing Company Limited, Hsinchu (TW)

(72) Inventors: Han-Jong Chia, Hsinchu (TW); Mauricio Manfrini, Zhubei (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 205 days.

(21) Appl. No.: 17/230,477

(22) Filed: Apr. 14, 2021

(65) Prior Publication Data
US 2021/0408223 A1 Dec. 30, 2021

Related U.S. Application Data

(60) Provisional application No. 63/045,320, filed on Jun. 29, 2020.

(51) Int. Cl.
| | |
|---|---|
| *H01L 29/51* | (2006.01) |
| *H01L 29/78* | (2006.01) |
| *H01L 29/66* | (2006.01) |
| *H01L 29/786* | (2006.01) |
| *H01L 21/28* | (2006.01) |
| *H10B 53/30* | (2023.01) |
| *H01L 21/02* | (2006.01) |
| *H01L 49/02* | (2006.01) |

(52) U.S. Cl.
CPC ........ *H01L 28/56* (2013.01); *H01L 21/02601* (2013.01); *H01L 28/60* (2013.01); *H01L 29/40111* (2019.08); *H01L 29/516* (2013.01); *H01L 29/6684* (2013.01); *H01L 29/66742* (2013.01); *H01L 29/66795* (2013.01); *H01L 29/7851* (2013.01); *H01L 29/78391* (2014.09); *H01L 29/78696* (2013.01); *H10B 53/30* (2023.02)

(58) Field of Classification Search
CPC ... H01L 21/02601; H01L 28/56; H01L 28/60; H01L 29/516; H01L 29/78391; H01L 29/7851; H10B 53/00–53/50
See application file for complete search history.

(56) References Cited

U.S. PATENT DOCUMENTS

| | | | |
|---|---|---|---|
| 2007/0045604 A1* | 3/2007 | Liu | H10N 70/023 257/E45.002 |
| 2009/0091876 A1* | 4/2009 | Yamakawa | H01G 4/33 29/25.42 |

(Continued)

*Primary Examiner* — Jose R Diaz
(74) *Attorney, Agent, or Firm* — The Marbury Law Group, PLLC

(57) ABSTRACT

A memory device, transistor, and methods of making the same, the memory device including a memory cell including: a bottom electrode layer; a high-k dielectric layer disposed on the bottom electrode layer; a discontinuous seed structure comprising discrete particles of a metal disposed on the high-k dielectric layer; a ferroelectric (FE) layer disposed on the seed structure and directly contacting portions of high-k dielectric layer exposed through the seed structure; and a top electrode layer disposed on the FE layer.

20 Claims, 15 Drawing Sheets

(56) References Cited

U.S. PATENT DOCUMENTS

2009/0224301 A1* 9/2009 Yamakawa ............ H10B 53/00
  257/295
2010/0163867 A1* 7/2010 Yamazaki ......... H01L 29/78696
  257/E21.04

* cited by examiner

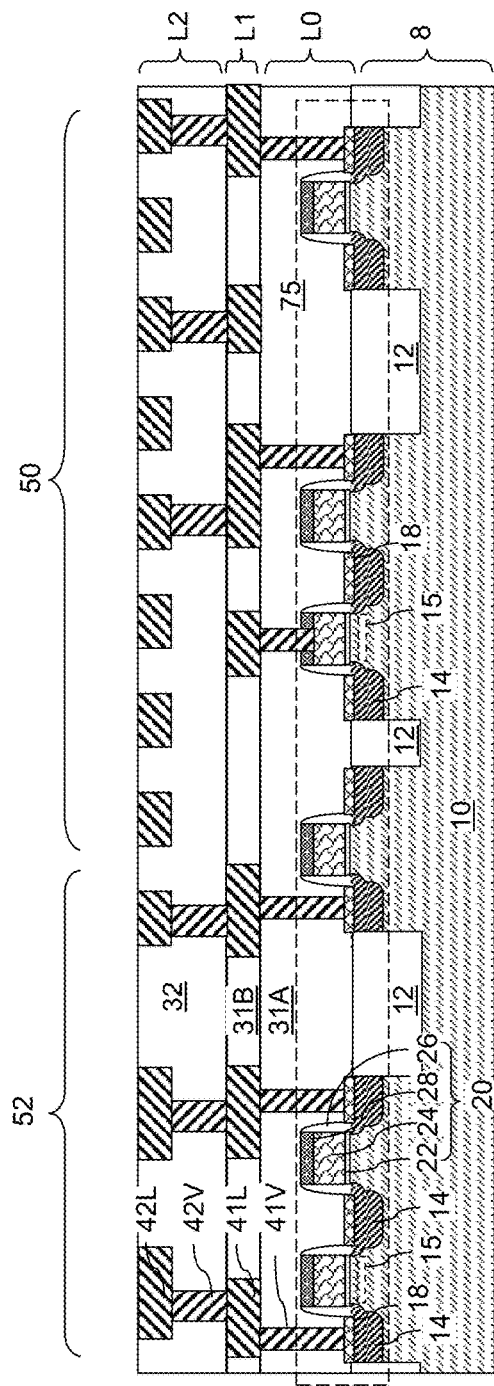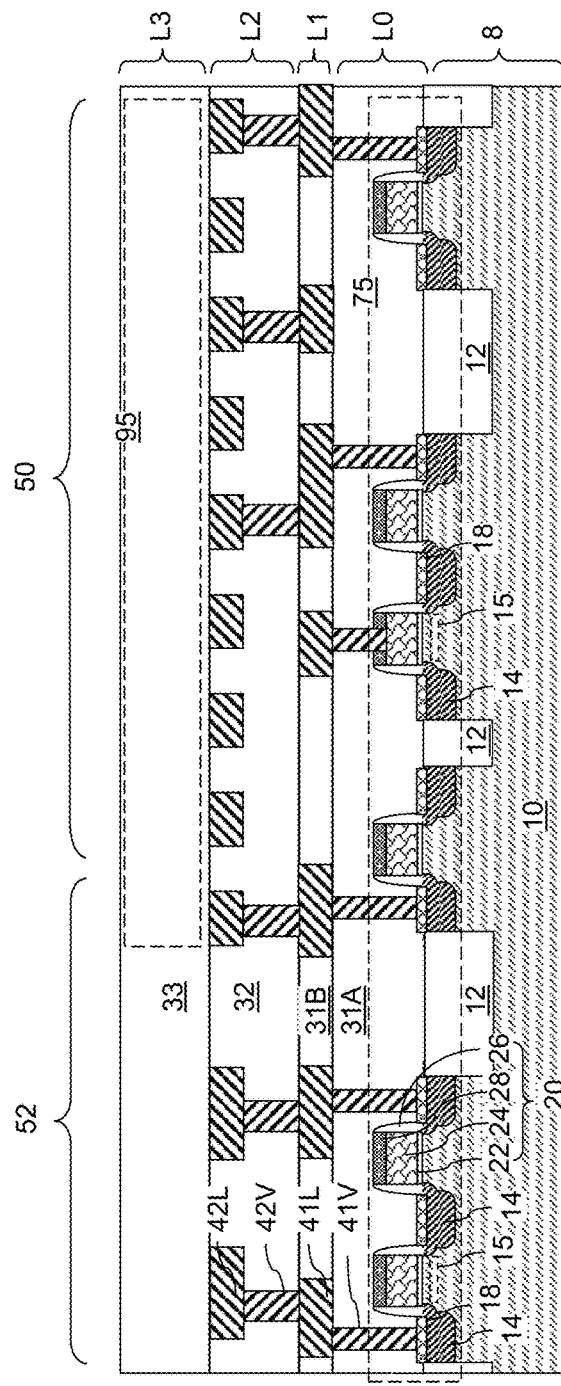
FIG. 1A
FIG. 1B

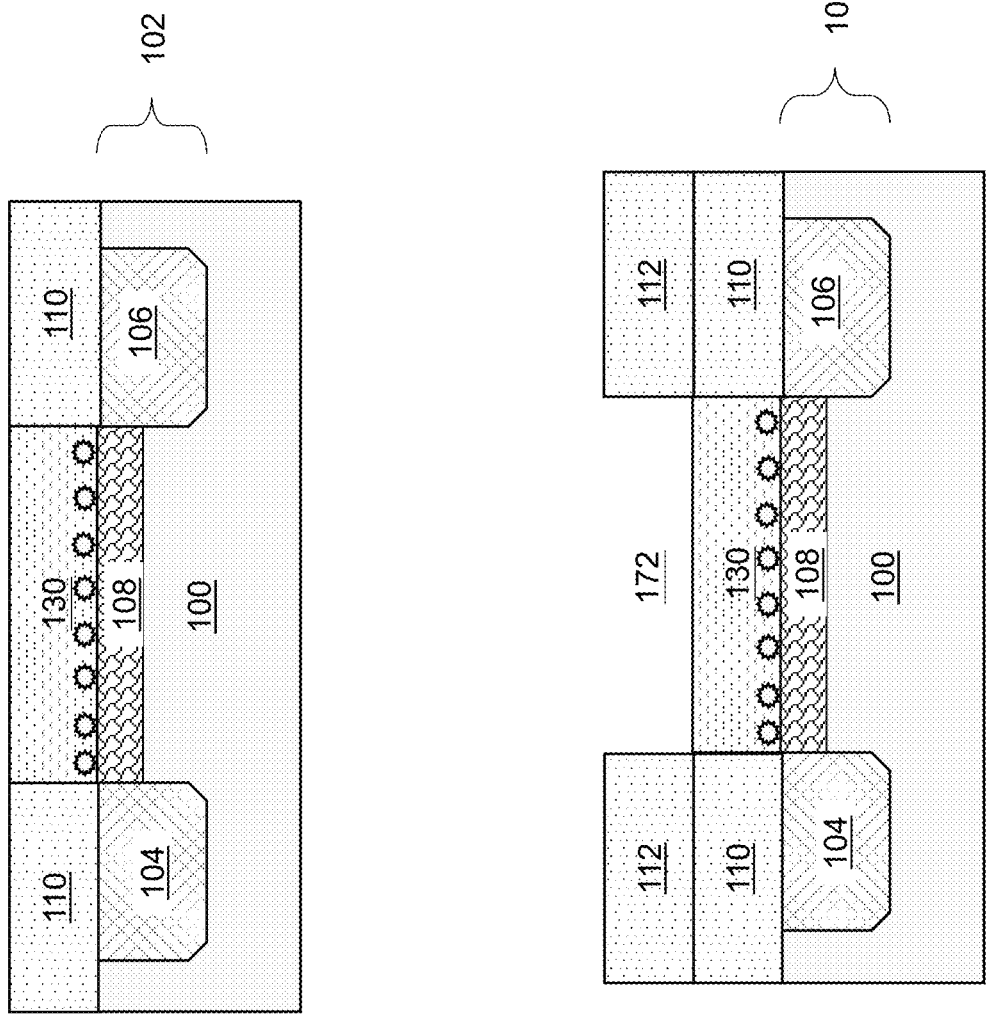

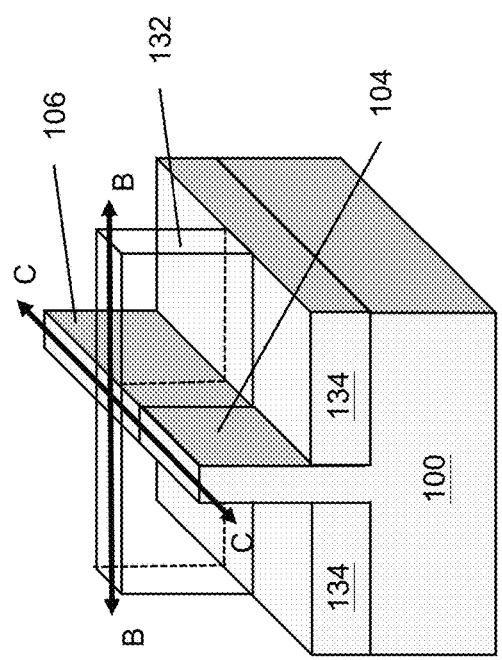
FIG. 6A
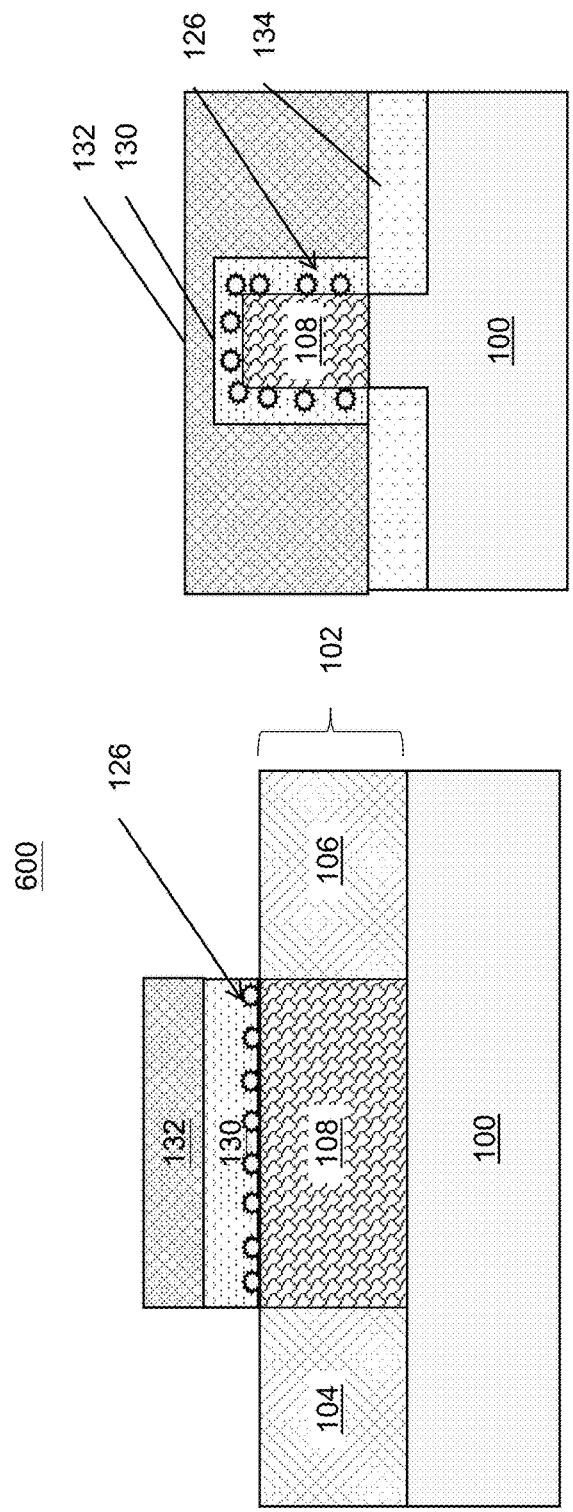
FIG. 6C
FIG. 6B

FERROELECTRIC TUNNEL JUNCTION DEVICES WITH DISCONTINUOUS SEED STRUCTURE AND METHODS FOR FORMING THE SAME

RELATED APPLICATIONS

This application claims priority to U.S. Provisional Patent Application No. 63/045,320 entitled "Interface Tuning in Ferroelectric Tunnel Junction", filed on Jun. 29, 2020, the entire contents of which are hereby incorporated by reference for all purposes.

BACKGROUND

Ferroelectric (FE) memory is a candidate for next generation non-volatile memory benefits due to its fast write/read speed and small size. However, it may be difficult to achieve a desired crystal structure when growing FE layers on commonly utilized semiconductor device materials. Various materials may be used to form the FE layer that may improve the FE properties such as coercivity ($E_c$), remanent polarization ($P_r$), hysteresis loop squareness (saturation remanence divided by saturation magnetization), etc. In particular, various techniques and materials may be used to obtain high orthorhombic crystalline phase FE layer in order to obtain good FE properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure prior to formation of an array of TFTs according to an embodiment of the present disclosure.

FIG. 1B is a vertical cross-sectional view of the first exemplary structure during formation of the array of fin back gate field effect transistors according to an embodiment of the present disclosure.

FIGS. 4A-4E are vertical cross-sectional views illustrating the steps of a method of manufacturing a transistor, according to various embodiments of the present disclosure.

FIG. 6A is a partially transparent perspective view of a transistor according to various embodiments of the present disclosure.

FIG. 6B is a vertical cross-sectional view taken along line C-C of FIG. 6A.

FIG. 6C is a vertical cross-sectional view taken along line B-B of FIG. 6A.

DETAILED DESCRIPTION

Figure 1C:
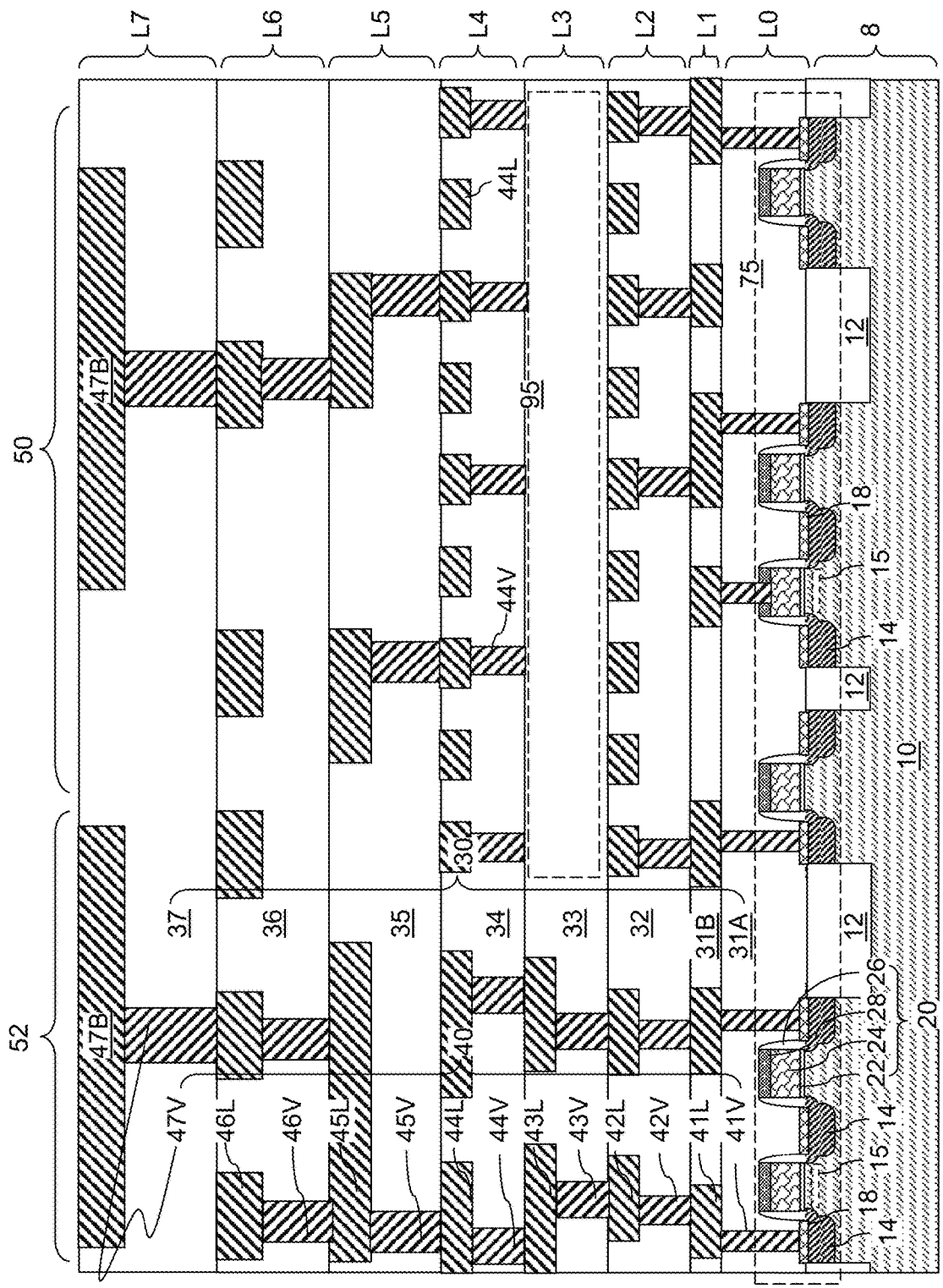
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to ferroelectric (FE) structures, and specifically, to memory cells, transistors, and memory structures that include FE layers grown on discontinuous seed structures that promote the growth of FE materials.

Memory devices include a grid of independently functioning memory cells formed on a substrate. Memory devices may include volatile memory or nonvolatile (NV) memory cells. In contrast to volatile memory cells that require constant power to retain their memory values, nonvolatile memory cells are capable of retaining information when power is not applied thereto. For example, computers including nonvolatile memory cells do not need to be booted up when switched on.

Emerging nonvolatile memory technologies may include resistive random-access memory (RRAM or ReRAM), magneto-resistive random-access memory (MRAM), ferroelectric (FE) random-access memory (FRAM, F-RAM, or FeRAM), and phase-change memory (PCM), for example.

FRAM is a random-access memory that utilizes memory cells that include a FE material to store information as FE polarization. An FE material has an equilibrium-state bulk electric dipole moment. This occurs in solid ceramics when ground state crystal structure involves spatial separation of ionic charges, and the unit cell lacks a center of symmetry. Nanoscale alignment of the microscopic electric dipole moments is responsible for bulk ferroelectric behavior. Typically, the magnitude of the dipole polarization and its orientation may be controlled by application of modest external electric fields. The change in orientation may be a good indication of the stored value.

FRAM is commonly organized in single-transistor, single-capacitor (1T/1C) or two-transistor, two-capacitor (2T/2C) configurations, in which each memory cell includes one or more access transistors. The non-volatility of an FRAM is due to the bi-stable characteristic of the FE material in the cell capacitor(s). The cells are typically organized in an array, such as folded-bit line, open-bit line architectures, etc., wherein the individual cells are selected by plate line and word line signals from address decoder circuitry, with the data being read from or written to the cells along bit lines using sense amp circuits. For example, in an open-bit line architecture, the bit-lines may be divided into multiple segments, and differential sense amplifiers may be placed in between bit-line segments. Because the sense amplifiers may be placed between bit-line segments, to route their outputs outside the array, an additional layer of interconnect placed above those used to construct the word-lines and bit-lines may be required. The folded bit-line array architecture routes bit-lines in pairs throughout the array. The close proximity of the paired bit-lines may provide superior common-mode noise rejection characteristics over open bit-line arrays. Folded-bit line architecture may be favored in modern DRAM ICs for its superior noise immunity. This architecture is referred to as folded because it takes its basis from the open array architecture from the perspective of the circuit schematic. The folded array architecture appears to remove DRAM cells in alternate pairs (because two DRAM cells share a single bit-line contact) from a column, then move the DRAM cells from an adjacent column into the voids.

FRAM memory cells may include a FE tunnel junction (FTJ). Generally, a FTJ may include a metal-FE-metal (MFM) structure, including an FE layer disposed between two metallic layers (e.g., electrodes). However, some FTJ's may include metal-FE-insulator-metal (MFIM) structure, where a dielectric layer is disposed between the FE layer and one of the metallic layers. In particular, the MFIM structure may provide improved charge response, as compared to the MFM structure.

Ferroelectric field effect transistors (FeFETs) are emerging devices, in which a FE layer is utilized as a gate insulating layer between a gate electrode and a channel region of an underlying semiconductor layer. Permanent electrical field polarization in the FE layer causes this type of device to retain the transistor's state (on or off) in the absence of any electrical bias.

The FE properties of an FE layer, such as coercive field (Ec), remnant polarization (Pr), polarization-electric field (P-E) loop squareness, etc., may depend upon the crystal structure of the FE layer. The crystal structure of the FE layer may further depend upon the materials in which the FE layer is directly contacting to form an FE interface. In addition, the crystal structure of a FE layer may be greatly influenced by the substrate upon which an FE layer is grown. In particular, for Hafnium oxide (HfO)-based ferroelectric materials, good FE properties may be dependent upon having a well-formed orthorhombic crystalline phase. For example, FE materials, such as hafnium oxide doped Zr, require a strong orthorhombic phase to exhibit strong polarization and coercive field. Both of these properties impact the FE device's ability to maintain data in memory. However, be difficult to grow a crystalline FE layer on a dielectric layer and/or a semiconductor layer. In particular, metal oxide dielectric layers, such as aluminum oxide ($Al_2O_3$) magnesiumoxide (MgO), lanthanum aluminate (($LaAlO_3$), abbreviated as (LAO)) and/or semiconductor material layers, such as amorphous silicon, pol silicon, and metal oxide semiconductor materials, may make less than ideal seed structures for growing crystalline FE layers thereon.

Accordingly, various embodiments provide methods of forming FE structures having improved FE properties, and transistors and memory including the same. In particular, various embodiments provide FE structures including a metallic seed structure deposited on a dielectric layer, and configured to induce the formation of an orthorhombic crystal structure in a FE layer formed on the dielectric layer. Herein, the metallic seed structure may also be referred to as a ferroelectric promotional layer or a seed layer. The metallic seed structure may also be referred to as a discontinuous seed metal structure.

In some memory devices, CMOS transistors may be used as the selecting transistor. However, size limitation of the CMOS transistor technology may be the limiting factor in improving the size and memory cell density of memory devices. The various embodiments described herein improve the size and memory cell density by using FE memory cells and/or FeFETs as cell selectors.

FIG. 1A is a vertical cross-sectional view of a first exemplary structure prior to formation of an array of memory devices according to an embodiment of the present disclosure. Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

For example, the at least one array of non-volatile memory cells may include resistive random-access memory (RRAM or ReRAM), magnetic/magneto-resistive random-access memory (MRAM), FeRAM, and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs and memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

FIG. 1B is a vertical cross-sectional view of the first exemplary structure during formation of the array of TFTs and/or memory cells according to an embodiment of the present disclosure. Referring to FIG. 1B, an array 95 of non-volatile memory cells and selector devices, such as TFT selectors, may be formed in the memory array region 50 over the second interconnect-level structure L2. The details for the structure and the processing steps for the array 95 of non-volatile memory cells and TFT selector devices are subsequently described in detail below. A third ILD layer 33 may be formed during formation of the array 95 of non-volatile memory cells and TFT selector devices. The set of all structures formed at the level of the array 95 of non-volatile memory cells and TFT selector devices transistors is herein referred to as a third interconnect-level structure L3.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

Figure 2A:
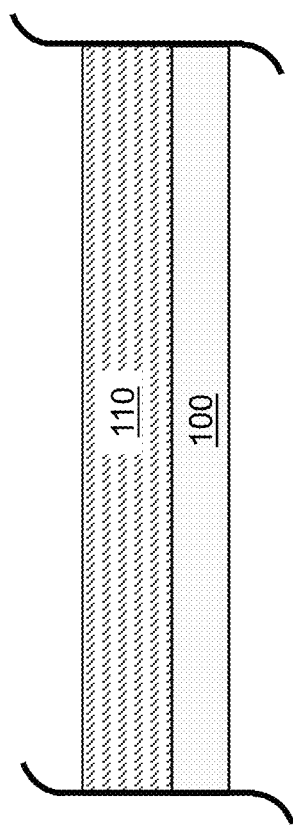
FIGS. 2A-2H are each vertical cross-sectional views illustrating the steps of manufacturing a memory cell, according to various embodiments of the present disclosure.

FIGS. 2A-2H are each vertical cross-sectional views illustrating the steps of a method of forming a memory cell 200, which may be included in the array 95 of FIG. 1C, according to various embodiments of the present disclosure. Referring to FIG. 2A, a first dielectric layer 110 may be deposited over a substrate 100. The substrate 100 may be any suitable substrate, such as a semiconductor device substrate, and may include control elements formed during FEOL processes. In some embodiments, one or more additional dielectric layers, such as ILD layers, may be deposited between the substrate 100 and the first dielectric layer 110. In such embodiments, the first dielectric layer 110 may be omitted.

The first dielectric layer 110 may be formed of any suitable dielectric material such as silicon oxide ($SiO_2$), or the like, or high-k dielectric materials such as silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. In some embodiments, the first dielectric layer 110 may be a native oxide layer formed on the substrate 100. Other suitable dielectric materials may also be within the contemplated scope of disclosure.

The first dielectric layer 110 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Figure 2B:
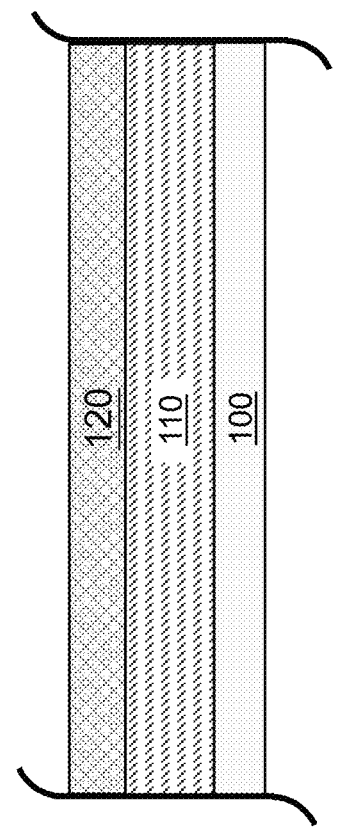

Referring to FIG. 2B, a bottom electrode layer 120 may be deposited on the first dielectric layer 110. For example, the bottom electrode layer 120 may be deposited on the upper surface of the first electric layer 110, such that the bottom electrode layer 120 contacts a top surface of the first dielectric layer 110.

In other embodiments, the bottom electrode layer may be embedded in the first dielectric layer 110. For example, the first dielectric layer may be patterned to form trenches, an electrically conductive material may be deposited in the trenches, and a planarization process may be performed to planarize upper surfaces of the bottom electrode layer 120 and the first dielectric layer 110.

The bottom electrode layer 120 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), alloys thereof, or the like. In some embodiments, the bottom electrode layer 120 may be formed of TiN, Ru, W, Mo, TaN, or the like. The bottom electrode layer 120 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. The thickness of the bottom electrode layer 120L may be in a range from 10 nm to 100 nm, although lesser and greater thicknesses may also be used.

Figure 2C:
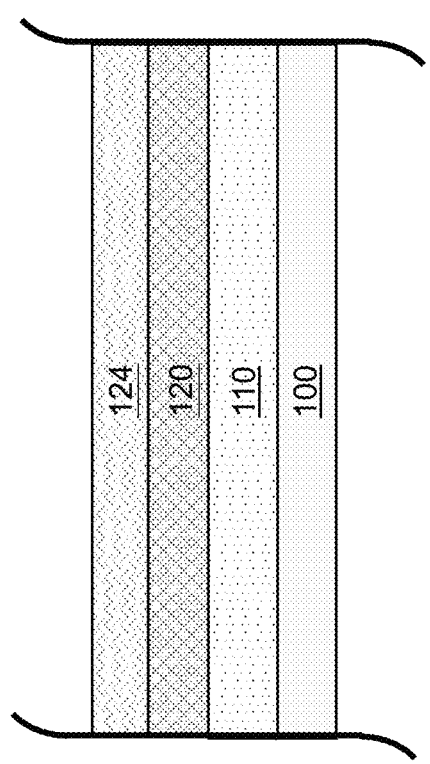

Referring to FIG. 2C, a high-k dielectric layer 124 may be deposited on the bottom electrode layer 120. Herein, high-k dielectric materials have a dielectric constant greater than 3.9 and may include, but are not limited to, silicon nitride ($SiN_x$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$) (HZO)), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), combinations thereof, or the like. Other suitable dielectric materials are within the scope of the present disclosure. The high-k dielectric layer 124 may be deposited using any suitable deposition processes, as described above. In some embodiments, the high-k dielectric layer 124 may comprise $Al_2O_3$, MgO, $LaAlO_3$, or the like.

Figure 2D:
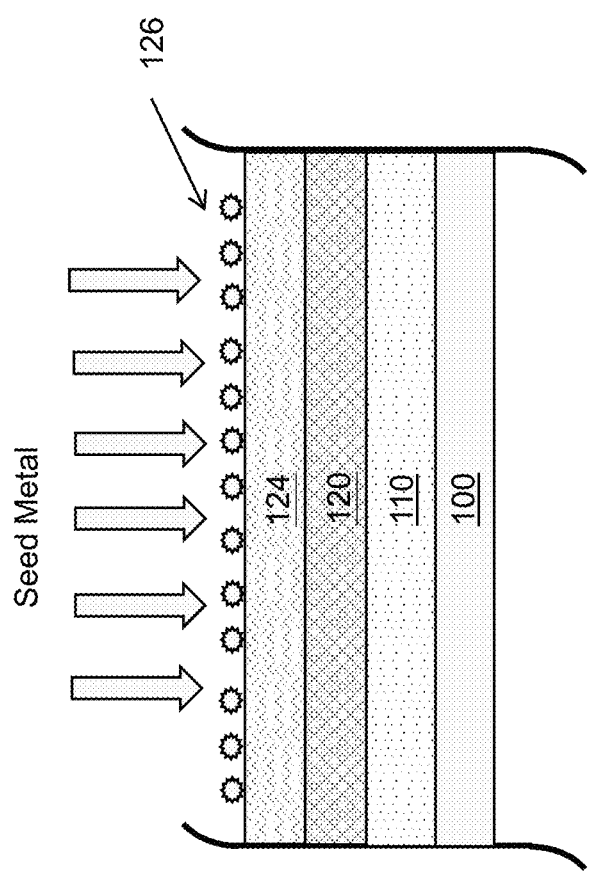

Referring to FIG. 2D, a discontinuous seed structure 126 (also referred to as a ferroelectrical promotional structure) may be formed on the high-k dielectric layer 124. The seed structure 126 may include a metal (e.g., a seed metal) configured to promote the formation of a desired crystal structure in a FE layer formed thereon. For example, the seed structure 126 may comprise tungsten (W), molybdenum (Mo), combinations thereof, or the like.

The seed structure 126 may be a discontinuous layer of metal particles, which may include discrete metal atoms or discrete metal nanoparticles. The seed structure 126 may be a discontinuous layer, such that the seed structure 126 does not form an electrically conductive path on the surface of the high-k dielectric layer 124. In various embodiments, the seed structure 126 does not form a continuous metal layer on the high-k dielectric layer 124. The seed structure 126 may have thickness, and/or seed metal particles may have an average particle size, ranging from about 1 angstrom to about 20 angstroms, such as from about 1 angstrom to about 10 angstroms, or from about 1 angstrom to about 5 angstroms. In some embodiments, the seed structure 126 may be a partial mono-layer of seed metal atoms. For example, the seed structure 126 may include from about ¼ to about ¾ of the seed metal atoms included in a full mono-layer of seed metal atoms.

The seed structure 126 may be formed by depositing a seed metal using any suitable deposition process. For example, the seed structure 126 may be formed using physical vapor deposition (PVD), chemical vapor deposition (CVD), atomic layer deposition (ALD), or the like. However other suitable processes for forming a discontinuous layer of seed metal may be used.

Figure 2E:
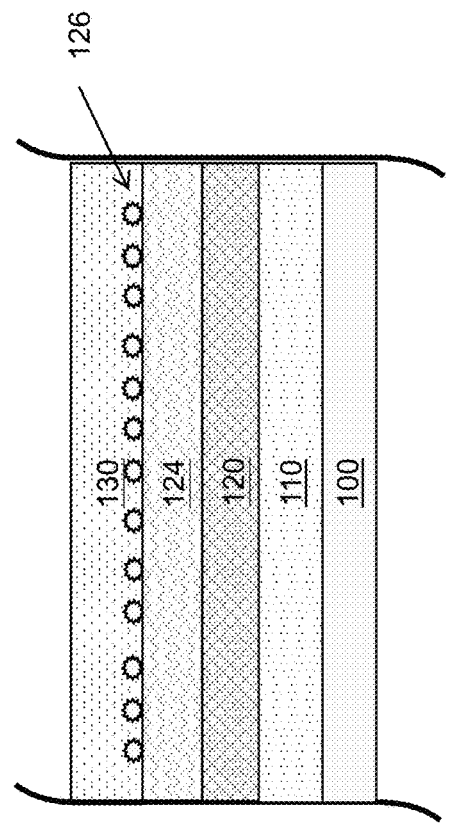

Referring to FIG. 2E, an FE layer 130 may be grown on the high-k dielectric layer 124 and the seed structure 126. The FE layer 130 may be formed of any suitable ferroelectric material, such as, $HfO_2$, $ZrO_2$, $Hf_{0.5}Zr_{0.5}O_2$ (HfZrO), HfSiO, HfLaO, AlScN, $PbZrO_3$, $Pb[Zr_xTi_{1-x}]O_3$, ($0 \le x \le 1$) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1-3}Nb_{2/3}O_3$ (PMN), $PbSc_{1-2}Ta_{1/2}O_3$ (PST), $SrBi_2Ta_2O_9$ (SBT), $Bi_{1/2}Na_{1/2}TiO_3$, combinations thereof, or the like. In some embodiments, the FE layer 130 may be formed of $HfO_2$, HfZrO, PZT, $PbTiO_3$, HfLaO, or the like. Other suitable ferroelectric materials are within the contemplated scope of disclosure.

The FE layer 130 may be formed by depositing an FE material using any suitable deposition method, such as PVD, spin coating and annealing, sputtering, CVD, ALD, plasma-enhanced chemical vapor deposition (PECVD), spray pyrolysis, pulsed laser deposition (PLD) or combinations thereof. During the deposition process, the seed metal may promote the growth of a desired crystal phase in the FE layer 130.

For example, when the FE layer 130 comprises a Hf-based FE material, the primary crystal phase of the FE layer 130 may have an orthorhombic crystal structure. If the FE layer 130 comprises a Pb-based material, such as PBT or PZT, the primary crystal phase of the FE layer 130 may have a tetragonal crystal structure. In particular, the primary crystal phase may account for at least 50 at %, such as from about 60 at % to about 99.9 at %, or from about 70 at % to about 95 at % of the FE layer 130.

In some embodiments, the FE layer 130 may be thermally annealed, to further improve the crystal structure thereof. For example, the FE layer 130 may be annealed using Excimer-laser annealing (ELA), flash lamp annealing (FLA), furnace annealing, or the like.

Figure 2F:
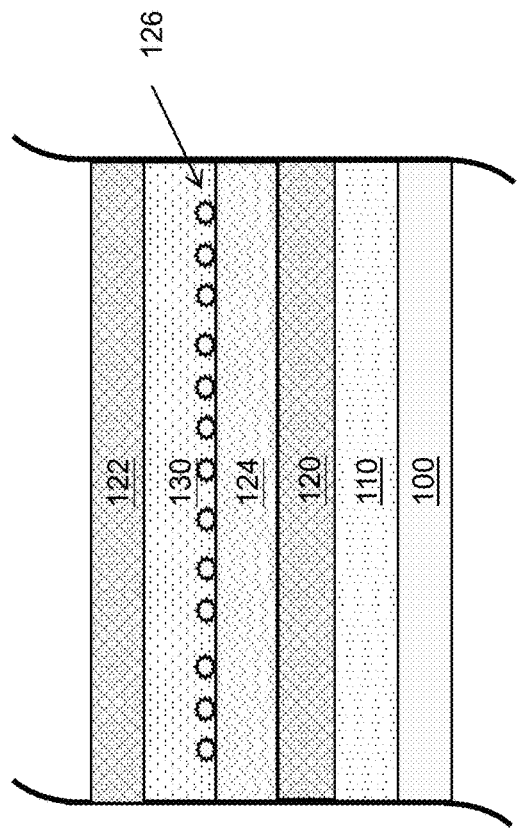

Referring to FIG. 2F, a top electrode layer 122 may be deposited on the FE layer 130. The top electrode layer 122 may include, and/or may consist essentially of, at least one of a transition metal, a conductive metallic nitride, and a conductive metallic carbide. Exemplary metallic materials that may be used for the top electrode layer 122 include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode layer 122 may include, and/or may consist essentially of, an elemental metal such as W, Cu, Ti, Ta, Ru, Co, Mo, or Pt. The thickness of the top electrode layer 122 may be in a range from 10 nm to 100 nm, although lesser and greater thicknesses may also be used.

Figure 2G:
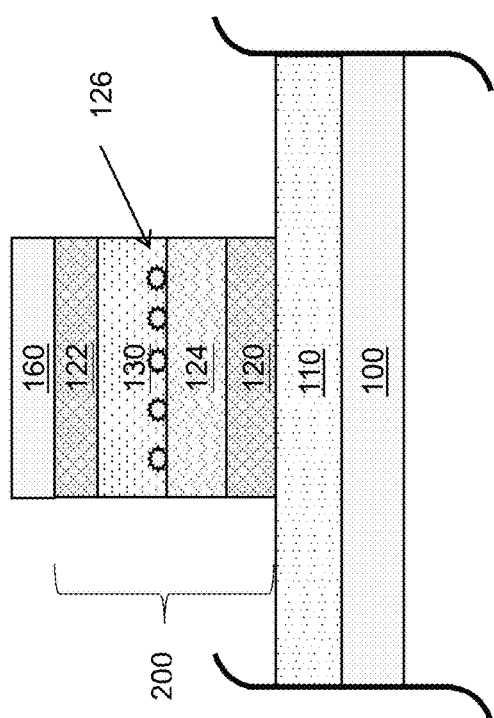

Referring to FIG. 2G, the layered structure (layers 120, 124, 130, 122) formed in FIG. 2F may be patterned to form at least one ferroelectric tunnel junction (FTJ) memory cells 200. In particular, a photoresist material may be deposited on the top electrode layer 122 and lithographically patterned to form a patterned photoresist layer 160. The layered structure may then be etched using the photoresist layer 160 as a mask, to etch unmasked portions of the layered structure and form one or more memory cells 200. The etching may be an anisotropic etching process, such as a wet or dry etching process. The photoresist layer 160 may be subsequently removed, for example, by ashing.

Figure 2H:
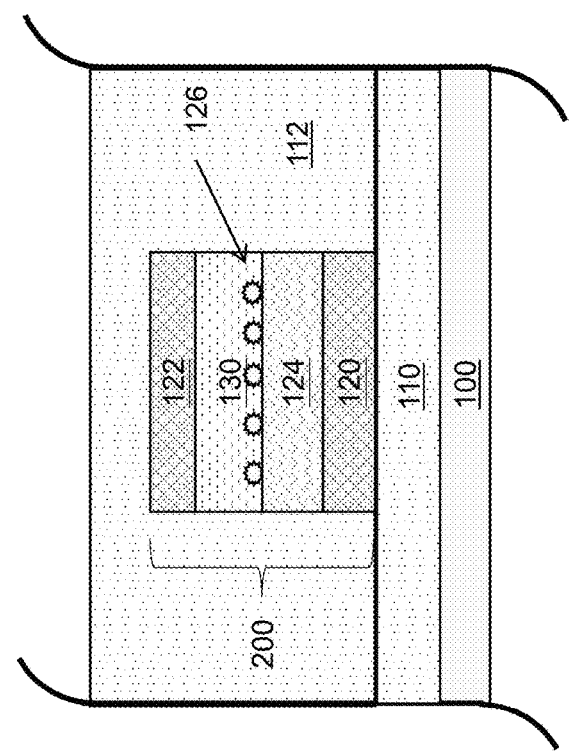

Referring to FIG. 2H, a second dielectric layer 112 (e.g., an interconnect dielectric layer), may be deposited on the first dielectric layer 110, covering the memory cell 200. In particular, the second dielectric layer 112 may be formed of any suitable dielectric material, such as silicon oxide, using any suitable deposition process as described herein. In some embodiments, the second dielectric layer 112 may be omitted.

In various embodiments, the FE layer 130 may be a ferroelectric film that is thin enough to allow tunneling of electrons there through. For example, the FE layer 130 may be about 1 nanometer (nm) to about 50 nm thick, such as from about 5 nm to about 25 nm, or about 10 nm thick.

Figure 3A:
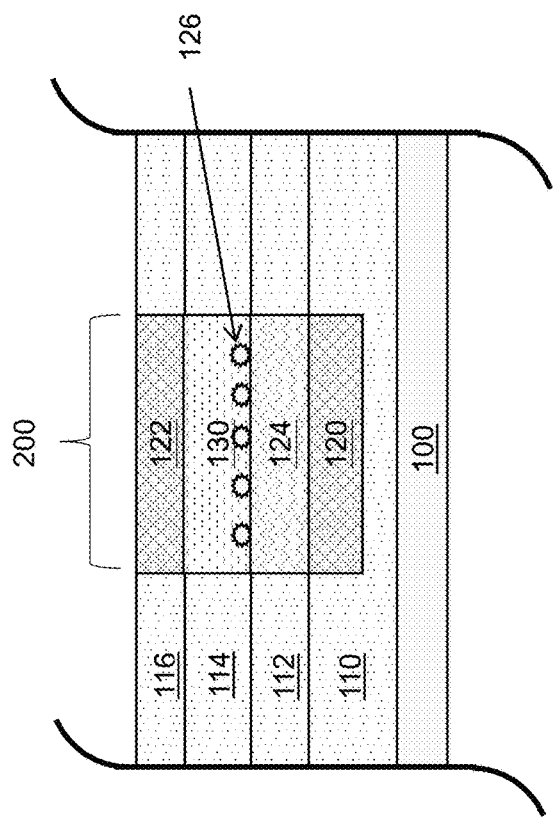
FIG. 3A is a vertical cross-sectional view illustrating a memory cell formed according to an alternative embodiment method of the present disclosure.

FIG. 3A is a vertical cross-sectional view of the memory cell 200 when formed by an alternate method. Referring to FIG. 3A, a first dielectric layer 110 deposited on a substrate 100. The first dielectric layer may be patterned to form a trench, for example, by photolithography. A bottom electrode layer may be deposited in the trench. A planarization process, such as chemical mechanical planarization (CMP) process, may be performed to planarize upper surfaces of the first dielectric layer 110 and the bottom electrode layer 120.

A second dielectric layer 112 may be deposited on the first dielectric layer 110 and the bottom electrode layer 120. The second dielectric layer 112 may be patterned to form a trench that exposes the bottom electrode layer 120. A high-k dielectric layer 124 may be deposited in the trench and on the bottom electrode layer 120. A planarization process, such as CMP, may be performed to planarize upper surfaces of the high-k dielectric layer 124 and the second dielectric layer 112.

A third dielectric layer 114 may be deposited on the second dielectric layer 112 and the high-k dielectric layer 124. The third dielectric layer 114 may be patterned to form a trench that exposes the high-k dielectric layer 124. A discontinuous seed structure 126 may be deposited on the high-k dielectric layer 124 and in the trench.

An FE layer 130 may be deposited in the trench, on the seed structure 126 and the high-k dielectric layer. A planarization process, such as CMP, may be performed to planarize upper surfaces of the FE layer 130 and the third dielectric layer 114.

A fourth dielectric layer 116 may be deposited on the third dielectric layer 114 and the FE layer 130. The fourth dielectric layer 116 may be patterned to form a trench that exposes the FE layer 130. A top electrode layer 122 may be deposited in the trench and on the FE layer 130. A planarization process, such as CMP, may be performed to planarize upper surfaces of the top electrode layer 122 and the fourth dielectric layer 116.

Figure 3B:
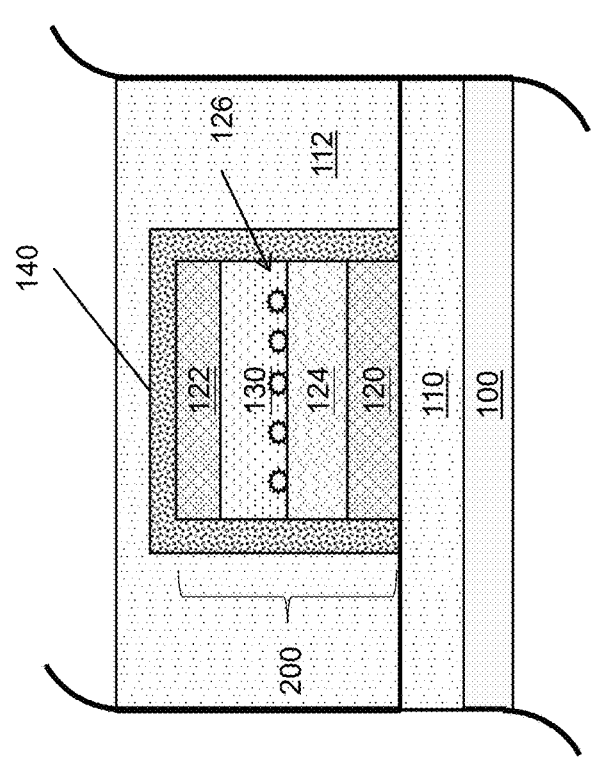
FIG. 3B is a vertical cross-sectional view illustrating a memory cell formed according to another alternative embodiment method of the present disclosure.

FIG. 3B is a vertical cross-sectional view of the memory cell 200 when formed by an alternate method. Referring to FIG. 3B, a memory cell 200 may be formed as discussed above with respect to FIGS. 2A-2G. An encapsulation layer 140 may be formed on the memory cell 200 using an encapsulation material and any suitable deposition process. For example, suitable encapsulation materials may include silicon nitride, aluminum oxide, or the like. A second dielectric layer 112 may then be optionally deposited on the encapsulation layer 140. After the deposition of the encapsulation layer 140, the second dielectric layer 112 may be deposited over the structure 200 and encapsulation layer 140. The second dielectric layer may be subsequently planarized as discussed above.

Figure 4A:
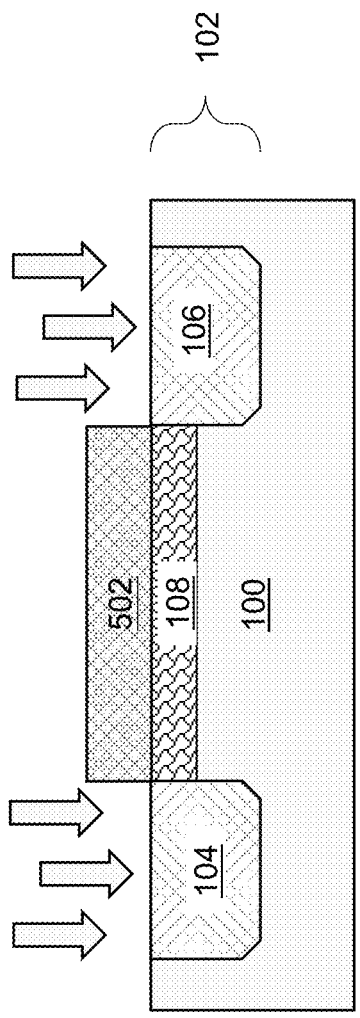

FIGS. 4A-4E are vertical cross-sectional views showing a method of forming of a transistor 400, according to various embodiments of the present disclosure. Referring to FIG. 4A, a semiconductor structure 102 may be formed on a semiconductor substrate 100, such as an amorphous silicon or polysilicon substrate. The semiconductor structure 102 may include a source region 104 and a drain region 106, which may be formed by doping portions of the substrate 100 with P or N-type impurities. For example, the source and drain regions 104, 106 may be formed by ion-implantation processes, or the like. A channel region 108 of the transistor 400 may be disposed between the source and drain regions 104, 106. The channel region 108 may include P or N-type impurities that are different from the P or N-type impurities doped into the source and drain regions 104, 106, such that the channel region 108 has a different conductivity-type than the source and drain regions 104, 106.

According to various embodiments, the semiconductor structure 102 may be formed using a replacement gate process. In particular, a replacement gate 502 (e.g., a dummy gate) may be formed on the substrate 100, covering the channel region 108. The replacement gate 502 may be formed by depositing a polysilicon material, for example, by physical vapor deposition (PVD) or chemical vapor deposition (CVD). The deposited material may be patterned and etched (e.g., wet or dry etched) to form the replacement gate 502.

An ion implantation process may then be performed, using the replacement gate 502 as a mask, to dope the semiconductor substrate 100 with impurities and form the source and drain regions 104, 106. The replacement gate 502 may be subsequently removed, before or after forming a first dielectric layer 110 on the substrate 102, as shown in FIG. 4B.

Figure 4B:
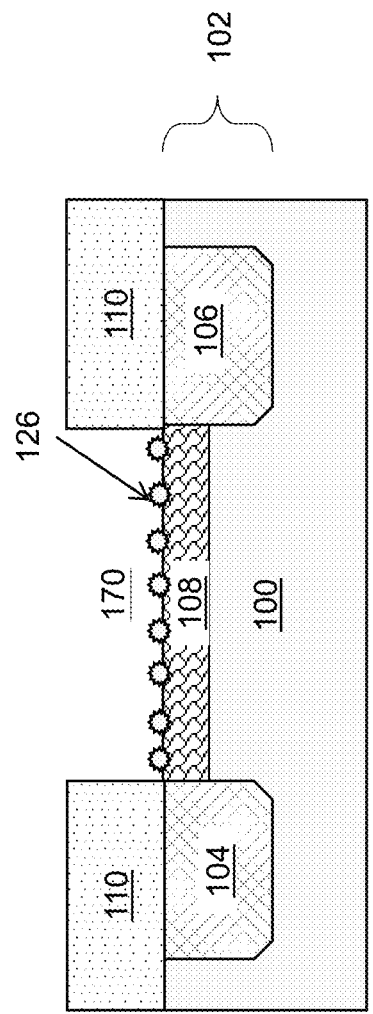

Referring to FIG. 4B, the first dielectric layer 110 may be formed on the semiconductor structure 102. The first dielectric layer 110 may be patterned to form a trench 170 that exposes the channel region 108. For example, a photoresist layer (not shown) may be applied over the first dielectric layer 110. The photoresist layer may then be patterned for example, using photolithography techniques such that portions of the first dielectric layer 110 disposed over the channel region 108 are exposed. The exposed portions of the first dielectric layer 110 may be etched to form trench 170. In other embodiments, the first dielectric layer 110 may be formed over the replacement gate 502, the resulting structure may optionally be planarized, and then the replacement gate 502 may be removed to form the trench 170.

A discontinuous seed structure 126 may be formed in the trench 170, on the surface of the channel region 108. The seed structure 126 may include a discontinuous layer of discrete metal particles, which may include discrete metal atoms or discrete metal nanoparticles, dispersed on the surface of the channel region 108. The seed structure 126 may be formed by PVD or CVD, for example. The metal may include at least one seed metal that promotes the formation of a desired crystal structure, such as an orthorhombic crystal structure, and may include metals such as W, Mo, or the like.

In various embodiments, the seed structure 126 does not form a continuous metal layer on the high-k dielectric layer 124. The seed structure 126 may have thickness, and/or seed metal atoms and/or nanoparticles may have a particle size, ranging from about 1 angstrom to about 20 angstroms, such as from about 1 angstrom to about 10 angstroms, or from about 1 angstrom to about 5 angstroms.

Referring to FIG. 4C, an FE layer 130 may be formed on the seed structure 126 (e.g., ferroelectrical promotional layer) and the channel region 108. The FE layer 130 may have an orthorhombic crystal structure resulting from being grown on the seed structure 126. The orthorhombic phase may be the primary crystal phase of the FE layer 130. In particular, at least 50 at %, such as from about 60 at % to about 99.9 at %, or from about 70 at % to about 95 at % of the FE layer 130 may have an orthorhombic crystal structure.

The FE layer 130 may be formed of materials and processes as described above with regard to FIG. 2E. The FE layer 130 may operate as a gate insulating layer of the transistor 400. A planarization process, such as CMP, may be performed to planarize the upper surfaces of the FE layer 130 and the first dielectric layer 110.

Figure 4E:
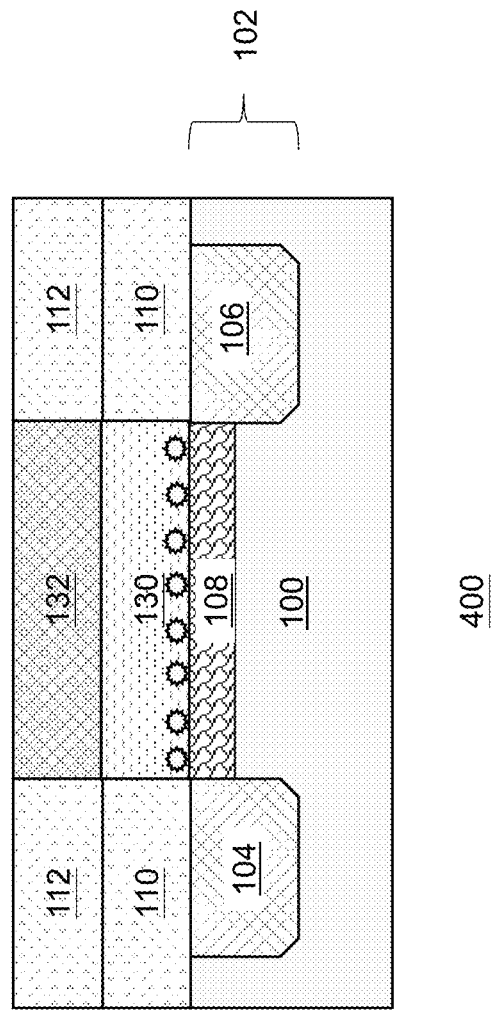

Referring to FIGS. 4D and 4E, a second dielectric layer 112 may be formed on the first dielectric layer 110. In a similar manner as described above, the second dielectric layer 112 may be patterned to form a trench 172 that exposes a top surface of the FE layer 130. A gate electrode 132 may be formed on the FE layer 130. The gate electrode 132 may include an electrically conductive material, and may be formed by any suitable deposition process, as described above with respect to the bottom and top electrode layers 120 and 122. In some embodiments, the gate electrode 132 may include an N-type work function material, such as Ta, TiAl, etc., or may include a P-type work function material, such as TiN, $WO_3$, etc. The work function of the gate electrode 132 may be selected based on the conductivity type of the channel region 108.

A planarization process, such as CMP, may be performed to planarize the upper surfaces of the gate electrode 132 and the second dielectric layer 112.

In various embodiments, the source region 104 may be electrically connected to a source electrode or bit line through contact vias (not shown). The drain region 106 may be electrically connected to a drain electrode through contact vias (not shown). The gate electrode 132 may be electrically connected to a word line of a semiconductor device, such as a memory device.

In some embodiments, the source and drain regions 104, 106 may be formed by depositing a metal layer on the substrate 100 overlapping with the channel region 108, or in trenches formed adjacent to the channel region 108. The metal layer may include metals such as Sc, Ti, Cr, Ni, Al, Nb, Pd, Pt, Au, Ag, or the like, and may be formed using any suitable method, such as PVD, CVD, ALD, or the like.

In some embodiments, after depositing the metal layer, an annealing process, such as a rapid thermal annealing process, may be performed, such that the metal diffuses into the substrate 100 and forms the source and drain regions 104, 106. In some embodiments, the metal may form a metal silicide in the source and drain regions 104, 106. The annealing process may be performed at a temperature below 500° C., such as at a temperature ranging from about 250° C. to about 450° C. The metal layer may be subsequently removed, for example, by selective etching. In other embodiments, the metal layer may be patterned to form source and drain electrodes.

While the transistor 400 is depicted as having a top-gate configuration, the present disclosure is not limited thereto. For example, in other embodiments, the transistor 400 may have a bottom-gate configuration.

Figure 5A:
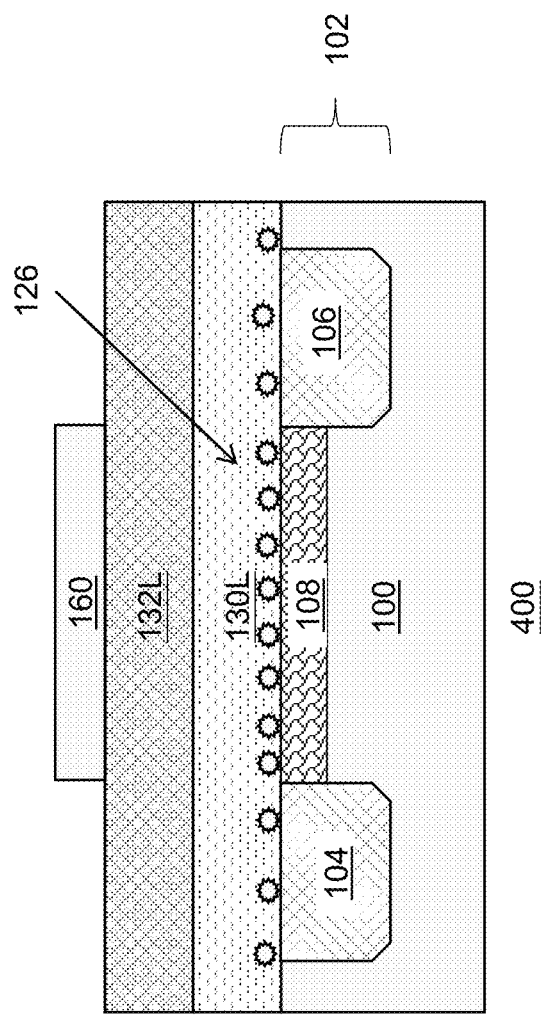
FIGS. 5A and 5B are vertical cross-sectional views illustrating the steps of an alternative method of manufacturing a transistor, according to various embodiments of the present disclosure.
Figure 5B:
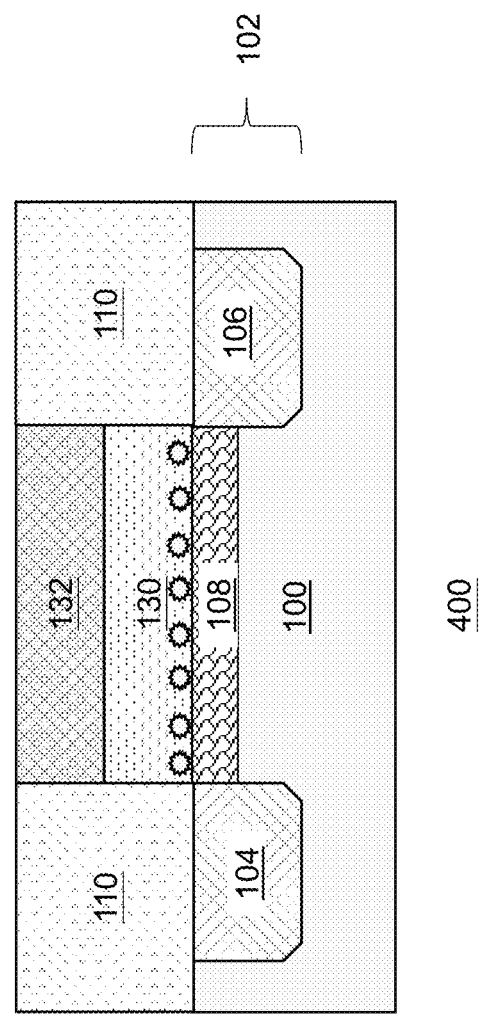

FIGS. 5A and 5B are vertical cross-sectional views of an alternative method of forming a transistor 400, according to various embodiments of the present disclosure. Referring to FIG. 5A, a seed structure 126 may be deposited on a substrate 100 including a semiconductor structure 102 including a source region 104, a drain region 106, and a channel region 108. An FE material layer 130L may be deposited on the seed structure 126, and a gate electrode material layer 132L may be deposited on the FE material layer 130L. A patterned photoresist layer 160 may be deposited over the gate electrode material layer 132L and patterned using photolithography techniques.

Referring to FIGS. 5A and 5B, the FE material layer 130L and the gate electrode material layer 132L may be etched, using the photoresist layer 160 as a mask, to form an FE layer 130 and a gate electrode 132. A dielectric layer 110 may be deposited on the resulting structure. In particular, a dielectric material 110 may be deposited on the substrate 100, so as to cover the source region 104, the drain region 106 and the gate electrode 132. A planarization process, such as CMP, may be performed to planarize top surfaces of the dielectric layer 110 and the gate electrode 132 to complete the transistor 400.

FIG. 6A is a partially transparent perspective view of a transistor 600, according to various embodiments of the present disclosure. FIG. 6B is a vertical cross-sectional view taken along line C-C of FIG. 6A. FIG. 6C is a vertical cross-sectional view taken along line B-B of FIG. 6A. The transistor 600 is similar to the transistor 400 of FIGS. 4E and 5B. Accordingly, only the differences there between will be described in detail.

Referring to FIGS. 6A-6C, the transistor 600 may be a ferroelectric fin field-effect transistor (FinFET). In some embodiments, the transistor 600 may operate as a memory structure. The semiconductor structure 102 is in the form of a "fin" that extends vertically from the surface of a semiconductor substrate 100. The semiconductor structure 102 includes a source region 104, a drain region 106, and a channel region 108 disposed there between.

A discontinuous seed structure 126 may be disposed on the surface of the channel region 108. In particular, the seed structure may include seed metal particles, such as seed metal atoms and/or nanoparticles dispersed on multiple surfaces of the channel region 108, such as on top and opposing side surfaces of the channel region 108. The seed structure 126 may be otherwise similar to the seed structure 126 of the transistor 400 of FIGS. 4E and 5B.

The transistor 600 may include an FE layer 130 disposed on the channel region 108, covering the seed structure 126. In particular, the FE layer may be grown on the channel region, with the seed structure 126 promoting the formation of an orthorhombic structure of the FE layer 130. In various embodiments, the FE layer 130 may be disposed on multiple surfaces of the channel region 108, such as on the top and opposing side surfaces of the channel region 108.

The transistor 600 may include a gate electrode 132 disposed on the FE layer 130. Accordingly, the FE layer 130 may face multiple surfaces of the channel region 108, such as the top and opposing side surfaces of the channel region 108.

The transistor 600 may include a dielectric layer 134, such as an oxide layer, that surrounds a portion of the semiconductor structure 102 adjacent to the substrate 100. In particular, the dielectric layer 134 may be configured to insulate the gate electrode 132 from the substrate 100 and/or channel region 108.

Figure 7:
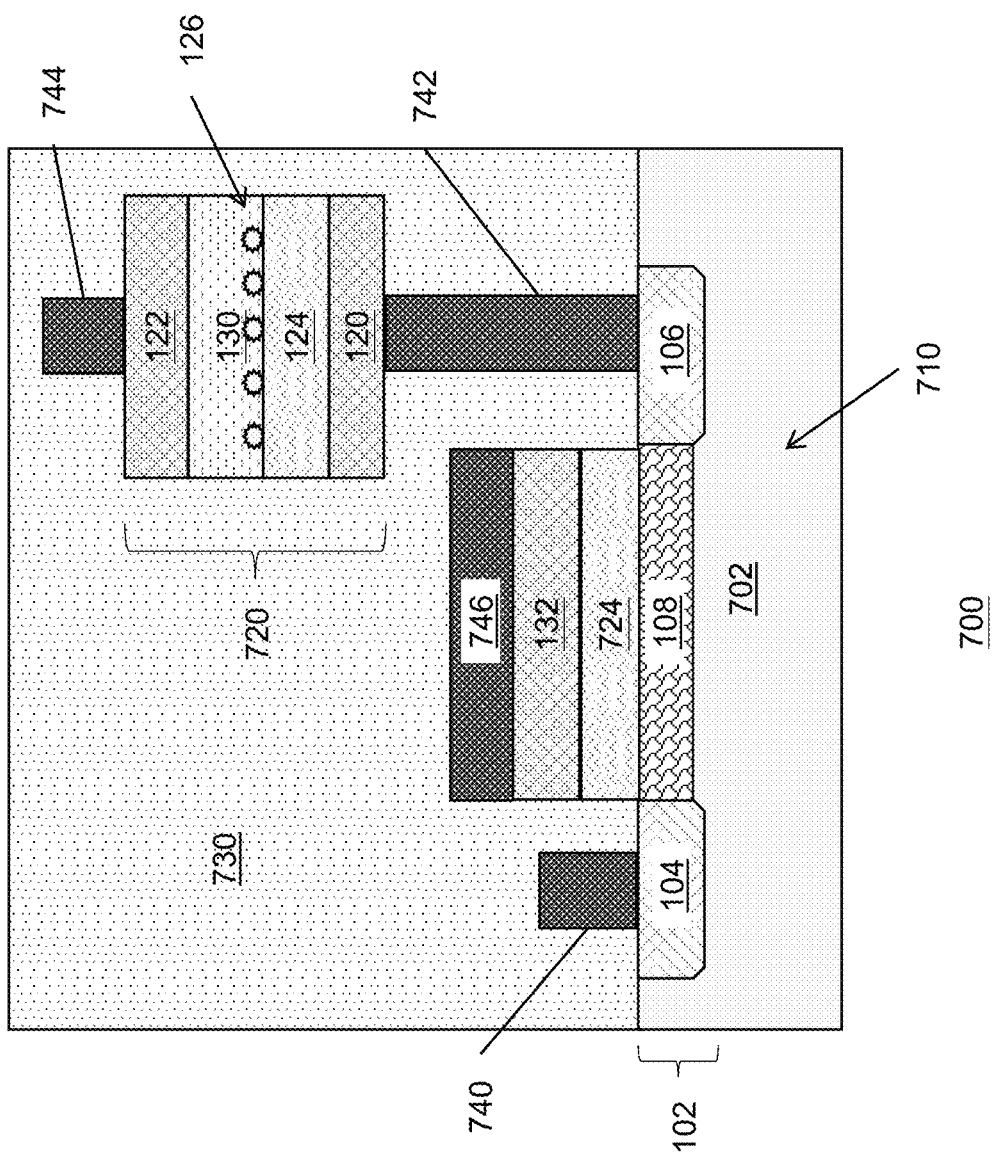
FIG. 7 is a vertical cross-sectional view of a memory device, according to various embodiments of the present disclosure.

FIG. 7 is a vertical cross-sectional view of a FeRAM memory structure 700, according to various embodiments of the present disclosure. The memory structure 700 may be included in a memory device, such as the memory device of FIGS. 1A-1C. The memory structure 700 may include a transistor 710 and a memory cell 720 (e.g., FJT). Accordingly, the memory structure 700 may have a 1 transistor-1 capacitor (1T-1C) configuration.

The transistor 710 may be disposed on a substrate 702. The substrate 702 may be a semiconductor substrate, such as an amorphous silicon or polysilicon substrate. In other embodiments, the substrate 702 may be a dielectric layer, such as an interconnect dielectric layer.

The transistor 710 may include a semiconductor structure 102 including a source region 104, a drain region 106, and a channel region 108 disposed there between. The semiconductor structure 102 may be formed of polysilicon, amorphous silicon, or a semiconducting oxide, such as InGaZnO (IGZO), indium tin oxide (ITO), InWO, InZnO, InSnO, GaOx, InO$_x$, or the like. Accordingly, the transistor 710 may be a CMOS transistor, if the substrate 702 is an amorphous silicon or polysilicon substrate, and the transistor 710 may be a TFT transistor, if the substrate 702 is a dielectric layer formed during a BEOL process. In some embodiments, the source region 104 and the drain region 106, may be formed by doping portions of the substrate 100 with P or N-type impurities.

In some embodiments, the source region 104 and drain region 106 may be formed by depositing a metal layer on the substrate 100 overlapping with the channel region 108, or in trenches formed adjacent to the channel region 108. The metal layer may include metals such as Sc, Ti, Cr, Ni, Al, Nb, Pd, Pt, Au, Ag, or the like, and may be formed using any suitable method, such as PVD, CVD, ALD, or the like.

In some embodiments, after depositing the metal layer, an annealing process, such as a rapid thermal annealing process, may be performed, such that the metal diffuses into the substrate 100 and forms the source and drain regions 104, 106. In some embodiments, the metal may form a metal silicide in the source and drain regions 104, 106. The annealing process may be performed at a temperature below 500° C., such as at a temperature ranging from about 250° C. to about 450° C. The metal layer may be subsequently removed, for example, by selective etching. In other embodiments, the metal layer may be patterned to form source and drain electrodes.

A transistor high-k dielectric layer 724 may be disposed on the channel region 108. In various embodiments, the transistor high-k dielectric layer 724 may have a thickness $t_{hk}$ in the range of 0.5-5.0 nm, such as 1-4 nm, although greater or lesser thicknesses may be used.

A gate electrode 132 may be disposed on the transistor high-k dielectric layer 724. The gate electrode may be formed of any suitable electrically conductive material, using any suitable deposition process, as described herein.

The memory cell 720 may be similar to the memory cell 200 shown in FIG. 2H. Accordingly, the memory cell 720 may include a bottom electrode layer 120, a high-k dielectric layer 124, a seed structure 126, an FE layer 120, and a top electrode layer 122, which may be formed as described above. The high-k dielectric layer 124 formed over the bottom electrode 120 may comprise the same or different dielectric material than is used for the transistor high-k dielectric layer 724.

The source region 104 may be electrically connected to a source line 740, the drain region 106 may be electrically connected to the bottom electrode layer 120 by a drain via contact 742, and the top electrode layer 122 may be electrically coupled to a bit line 744. The gate electrode 132 may be electrically connected to a word line 746. At least one dielectric layer 730, such as an interconnect dielectric layer, may be disposed on the substrate 702. In particular, the transistor high-k dielectric layer 724, gate electrode 132, source line 740, drain via contact 742, bit line 744, word line 746, and memory cell 720 may be embedded in the dielectric layer 730.

Figure 8:
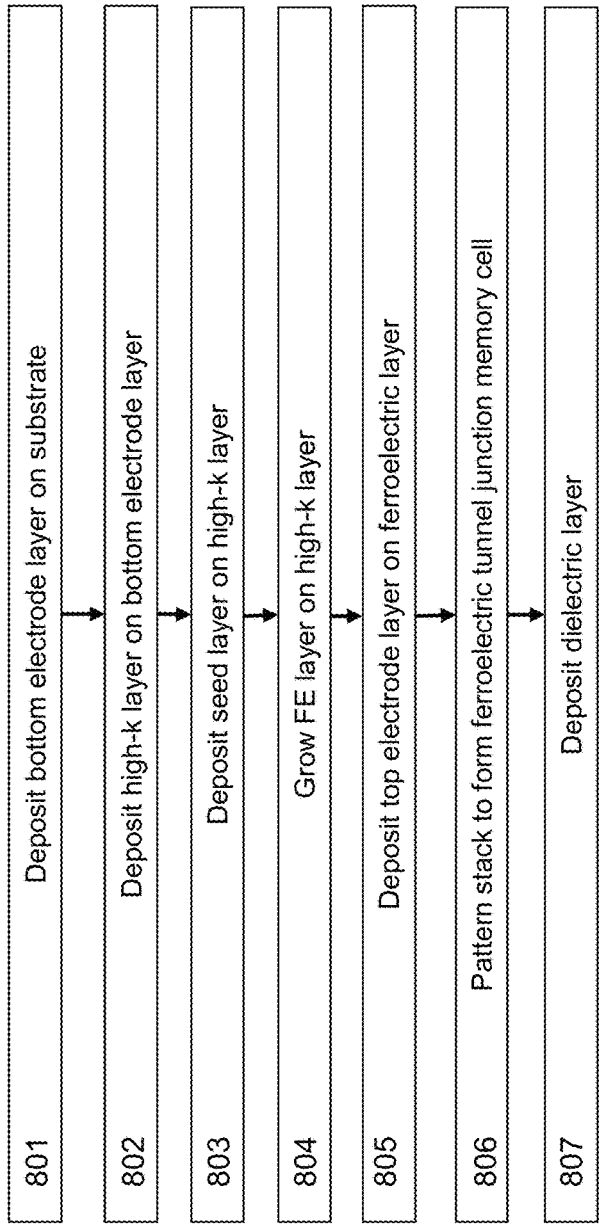
FIG. 8 is a block diagram illustrating a method of forming a memory cell, according to various embodiments.

FIG. 8 is a flow chart illustrating steps of a method of forming a memory cell 200 as shown in FIGS. 2H, 3A, and 3B, according to various embodiments of the present disclosure. Referring to FIGS. 2A-2H and 6, in step 801, a bottom electrode layer 120 may be deposited on a substrate, such as a dielectric layer. The bottom electrode layer 120 may be formed by depositing an electrically conductive material, such as copper, aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), alloys thereof, or the like. In some embodiments, the bottom electrode may be formed of TiN, Ru, W, Mo, TaN, or the like.

The bottom electrode layer 120 may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. In some embodiments, the top electrode layer 122 may be formed of TiN, Ru, W, Mo, TaN, or the like.

In step 802, a high-k dielectric layer 124 may be deposited on the bottom electrode layer 120. The high-k dielectric layer 124 may be formed of a high-k material such as silicon nitride ($SiN_x$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$)(HZO)), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), combinations thereof, or the like. Other suitable dielectric materials are within the scope of the present disclosure. The high-k dielectric layer 124 may be deposited using any suitable deposition process, as described above. In some embodiments, the high-k dielectric layer 124 may comprise $Al_2O_3$, MgO, $LaAlO_3$, or the like.

In step 803, a discontinuous seed structure 126 may be formed on the high-k dielectric layer 124. The seed structure 126 may be formed by depositing seed metal atoms and/or nanoparticles on the high-k dielectric layer 124 using a suitable deposition method. Suitable deposition methods may include PVD, CVD, ALD, or the like, for example. The deposition time of the seed structure 126 may be controlled, such that the seed structure 126 may include from about ¼ to about ¾ of the seed metal atoms included in a full mono-layer of seed metal atoms. The seed metal may include metals that promote the formation of a desired crystal structure in a subsequently formed FE layer 130, for example, the seed metal may comprise W, Mo, or the like, to promote the formation of an orthorhombic crystal structure.

In step 804, an FE layer 130 may be grown on the high-k dielectric layer 124 and the seed structure 126. During the deposition process, the seed metal atoms and/or nanoparticles may promote the formation of an orthorhombic crystal structure during growth of the FE layer 130. The FE layer 130 may be formed using any suitable deposition process, using any suitable FE material, as described herein such as, $HfO_2$, $ZrO_2$, $Hf_{0.5}Zr_{0.5}O_2$ (HfZrO), HfSiO, HfLaO, AlScN, $PbZrO_3$, $Pb[Zr_xTi_{1-x}]O_3$, (0≤x≤) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, combinations thereof, or the like. In some embodiments, the FE layer 130 may be formed of $HfO_2$, HfZrO, PZT, $PbTiO_3$, HfLaO, or the like.

In step 805, a top electrode layer 122 may be formed on the FE layer 130. The top electrode layer 122 may be formed of an electrically conductive material, using processes as described with respect to the bottom electrode layer 120.

In step 806, the structure formed in steps 801-805 may be patterned to form one or more memory cells 200. In particular, a photoresist material may be deposited on the top electrode layer 122, patterned using a photolithographic process to form a patterned photoresist layer 160, and then portions exposed through the photoresist layer of the structure may be etched using a wet or dry etching process.

In step 807, the method may optionally include covering the memory cell 200 with a dielectric layer, using any suitable dielectric material and any suitable deposition process.

Figure 9:
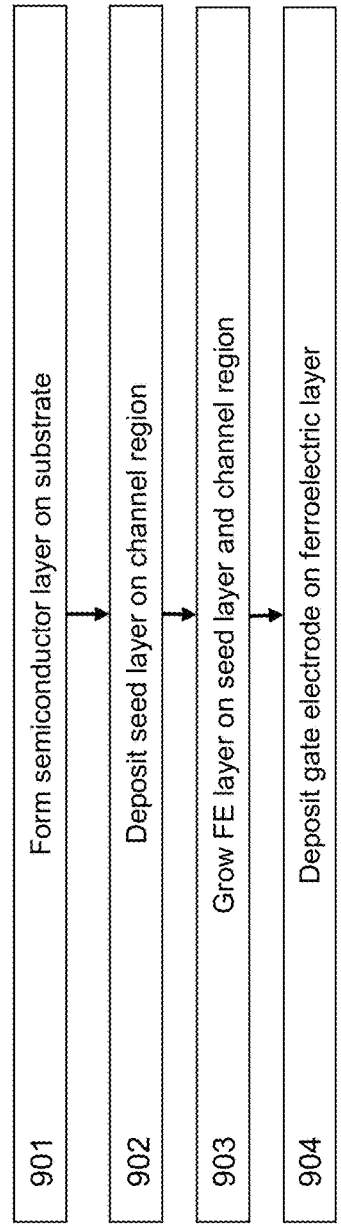
FIG. 9 is a block diagram illustrating a method of forming a transistor, according to various embodiments of the present disclosure.

FIG. 9 is a flow chart illustrating steps of a method of forming transistors 400, 700, as shown in FIGS. 4E, 5A, and 5B, according to various embodiments of the present disclosure. Referring to FIGS. 4E, 5A, 5B, and 8, in step 901 a semiconductor structure 102 may be formed on a substrate 100. For example, source, drain, and/or channel regions 104, 106, 108 may be formed by implanting dopants, such as by an ion implantation process. In some embodiments, the source and drain regions 104, 106 may be formed using a replacement gate process, as discussed above. In other embodiments, the source and drain regions 104, 106 may be formed of a deposited metal, or a metal silicide, as described above.

In step 902, a discontinuous seed structure 126 may be formed on the channel region. For example, the seed structure 126 may include discrete particles comprising single seed metal atoms and/or seed metal nanoparticles deposited on the channel region 108 by PVD or CVD, for example.

In step 903, an FE layer 130 may be grown on the channel region 108 and the seed structure 126. The FE layer 130 may be formed using any suitable deposition process, using any suitable FE material, as described herein such as, $HfO_2$, $ZrO_2$, $Hf_{0.5}Zr_{0.5}O_2$ (HfZrO), HfSiO, HfLaO, AlScN, $PbZrO_3$, $Pb[Zr_xTi_{1-x}]O_3$, (0≤x≤) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, combinations thereof, or the like. In some embodiments, the FE layer 130 may be formed of $HfO_2$, HfZrO, PZT, $PbTiO_3$, HfLaO, or the like.

In step 904, a gate electrode 132 may be deposited on the FE layer 130. The gate electrode 132 may formed of an electrically conductive material, using a suitable deposition process, as described herein.

Figure 10A:
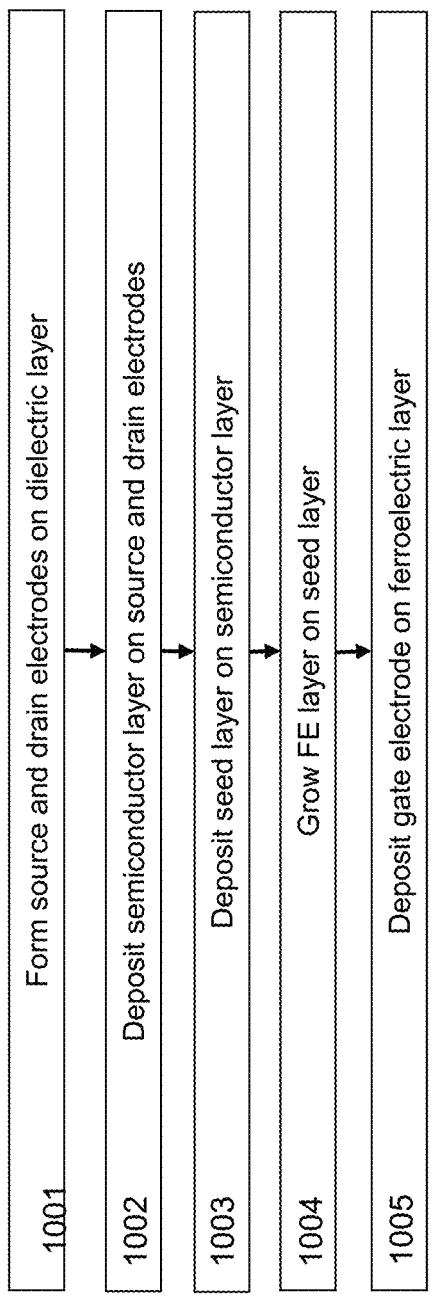
FIG. 10A is a flow chart illustrating steps of a method of a thin film transistor (TFT), according to various embodiments of the present disclosure.
Figure 10B:
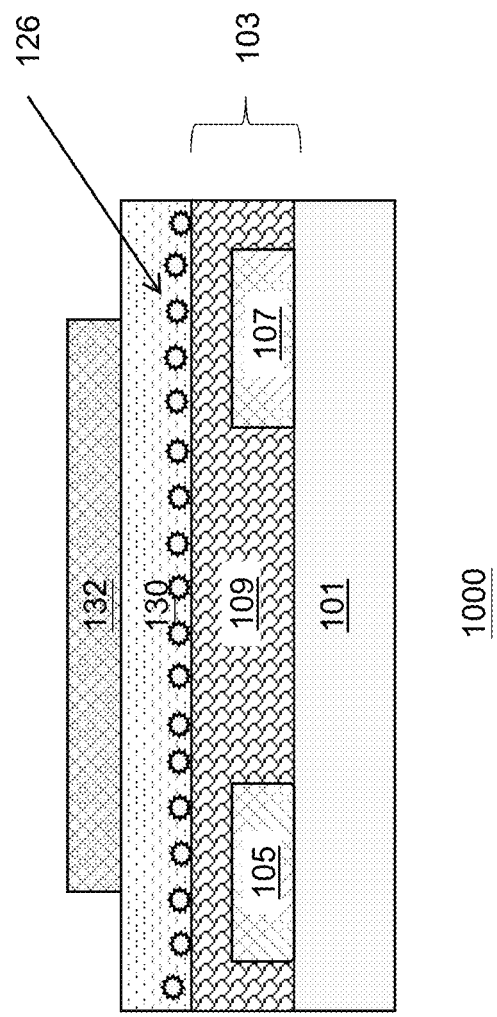
FIG. 10B is a cross-sectional view showing a TFT 100 formed by the method of FIG. 10A.

FIG. 10A is a flow chart illustrating steps of a method of a thin film transistor (TFT), according to various embodiments of the present disclosure, and FIG. 10B is a cross-sectional view showing a TFT 1000 formed by the method of FIG. 10A.

Referring to FIGS. 10A and 10B, in step 1001, a source electrode 105 and a drain electrode 107 may be formed on a dielectric layer 101. The source electrode 105 and drain electrode 107 may be formed by depositing a layer of metal, such as copper, aluminum, tungsten, or the like, using any suitable deposition method, and then patterning the deposited metal layer. Other suitable metal materials may be used to form the source electrode 105 and drain electrode 107. For example, the metal layer may include metals such as Sc, Ti, Cr, Ni, Al, Nb, Pd, Pt, Au, Ag, or the like, and may be formed using any suitable method, such as PVD, CVD, ALD, or the like. The dielectric layer 101 may be formed of any suitable dielectric material, such as silicon oxide, silicon nitride, or a glass material.

In step 1002, a semiconductor layer 109 may be deposited over the source electrode 105 and drain electrode 107, using any suitable deposition method to form a semiconductor structure 103. The semiconductor layer 109 may be formed of polysilicon, amorphous silicon, or a semiconducting oxide, such as InGaZnO (IGZO), indium tin oxide (ITO), InWO, InZnO, InSnO, GaOx, $InO_x$, or the like.

In step 1003, a discontinuous seed structure 126 may be deposited on the semiconductor layer 109. The seed structure 126 may include seed metal atoms and/or particles deposited on the semiconductor layer 109 by PVD or CVD, for example.

In step 1004, an FE layer 130 may be grown on the seed structure 126. The FE layer 130 may be formed using any suitable deposition process, using any suitable FE material, as described herein such as, $HfO_2$, $ZrO_2$, $Hf_{0.5}Zr_{0.5}O_2$ (HfZrO), HfSiO, HfLaO, AlScN, $PbZrO_3$, $Pb[Zr_xTi_{1-x}]O_3$, ($0 \leq x \leq$) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, combinations thereof, or the like. In some embodiments, the FE layer 130 may be formed of $HfO_2$, HfZrO, PZT, $PbTiO_3$, HfLaO, or the like.

In step 1005, a gate electrode 132 may be deposited on the FE layer 130. The gate electrode 132 may be formed of an electrically conductive material, using a suitable deposition process, as described herein.

Various embodiments provide a memory device comprising a memory cell 200 comprising: a bottom electrode layer 120; a high-k dielectric layer 124 disposed on the bottom electrode layer 120; a discontinuous seed structure 126 comprising discrete atoms and/or nanoparticles of a seed metal disposed on the high-k dielectric layer 124; a ferroelectric (FE) layer 130 disposed on the seed structure 126 and directly contacting portions of high-k dielectric layer 124 exposed through the seed structure 126; and a top electrode layer 122 disposed on the FE layer 130.

In one embodiment, the seed structure 126 comprises particles of W, Mo, or a combination thereof. In one embodiment, the seed structure 126 has an average particle size ranging from about 1 angstrom to about 10 angstroms. In another embodiment, the high-k dielectric layer 124 comprises AlO, MgO, $LaAlO_3$, or a combination thereof. In another embodiment, the FE layer 130 comprises $HfO_2$, HfZrO, Pb[ZrxTi1-x]O3, ($0 \leq x \leq 1$), $PbTiO_3$, HfLaO, or a combination thereof. In another embodiment, a primary phase of the FE layer 130 is orthorhombic. In another embodiment, a primary phase of the FE layer 130 is orthorhombic, wherein the orthorhombic phase represents from about 60 atomic percent (at %) to about 99.9 at % of the FE layer. In another embodiment, the memory device may further include a substrate 100; a transistor 710 disposed on the substrate 702, the transistor 710 comprising: a source region 104 and a drain region 106 formed in the substrate 702; a channel region 108 formed in the substrate 100 between the source and drain regions 104, 106; a high-k dielectric layer 724 disposed on the channel region 108; a gate electrode 132 disposed on the high-k dielectric layer 724; wherein the bottom electrode layer 120 of the memory cell 720 is electrically connected to the drain region 106. The embodiment may include a bit line 740 electrically coupled to the source region 104; a drain via contact 742 electrically coupled to the drain region 106 and the bottom electrode layer 120; and a word line 746 electrically coupled to the gate electrode 132.

Various embodiments provide a transistor 400, 700 comprising: a semiconductor structure 102 comprising a source region 104, a drain region 106, and a channel region 108 disposed between the source region 104 and the drain region 106; a discontinuous seed structure 126 comprising discrete atoms and/or nanoparticles of a seed metal disposed on the channel region 108; a ferroelectric (FE) layer 130 disposed on the seed structure 126 and directly contacting portions of the channel region 108 exposed through the seed structure 126; and a gate electrode 132 disposed on the FE layer 130.

Various embodiments provide method of forming a memory cell 200, comprising: depositing a high-k dielectric layer 124 over a substrate 100; depositing a discontinuous seed structure 126 comprising discrete atoms and/or nanoparticles of a seed metal disposed on the high-k dielectric layer 124; growing a ferroelectric (FE) layer 130 on the seed structure 126 and portions of the high-k dielectric layer 124 exposed through the seed structure 126, wherein the seed metal promotes the formation of an orthorhombic phase in the FE layer 130.

According to various embodiments, provided are memory cells and transistors that include seed structures configured to promote the formation of an orthorhombic phase in FE layers formed thereon. As such, the memory cells and transistors may exhibit improved ferroelectric properties.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising a memory cell comprising:
   a bottom electrode layer;
   a high-k dielectric layer disposed on the bottom electrode layer;
   a discontinuous seed structure comprising particles of a metal disposed on the high-k dielectric layer;
   a ferroelectric (FE) layer disposed on the seed structure and directly contacting portions of high-k dielectric layer exposed through the seed structure; and
   a top electrode layer disposed on the FE layer.

2. The memory device of claim 1, wherein the metal comprises W, Mo, or a combination thereof.

3. The memory device of claim 2, wherein the seed structure has an average particle size ranging from about 1 angstrom to about 10 angstroms.

4. The memory device of claim 1, wherein the high-k dielectric layer comprises AlO, MgO, $LaAlO_3$, or a combination thereof.

5. The memory device of claim 4, wherein the FE layer comprises $HfO_2$, HfZrO, $Pb[Zr_xTi_{1-x}]O_3$, ($0 \leq x \leq 1$), $PbTiO_3$, HfLaO, or a combination thereof.

6. The memory device of claim 4, wherein a primary phase of the FE layer is an orthorhombic phase.

7. The memory device of claim 6, wherein the orthorhombic phase represents from about 60 atomic percent (at %) to about 99.9 at % of the FE layer.

8. The memory device of claim 1, further comprising:
a substrate;
a transistor disposed on the substrate, the transistor comprising:
   a source region and a drain region formed in the substrate;
   a channel region formed in the substrate between the source and drain regions;
   a transistor high-k dielectric layer disposed on the channel region;
   a gate electrode disposed on the transistor high-k dielectric layer;
wherein the bottom electrode layer of the memory cell is electrically connected to the source region or the drain region.

9. The memory device of claim 8, further comprising:
a bit line electrically coupled to the source region;
a drain via contact electrically coupled to the drain region and the bottom electrode layer; and
a word line electrically coupled to the gate electrode.

10. A memory device comprising a memory cell comprising:
a high-k dielectric layer;
a discontinuous seed structure disposed on the high-k dielectric layer, the discontinuous seed structure comprising particles of a W, Mo, or a combination thereof; and
a ferroelectric (FE) layer disposed on the seed structure and directly contacting portions of high-k dielectric layer exposed through the seed structure.

11. The memory cell of claim 10, wherein the seed structure has an average particle size ranging from about 1 angstrom to about 10 angstroms.

12. The memory cell of claim 10, wherein the FE layer comprises $HfO_2$, HfZrO, $Pb[Zr_xTi_{1-x}]O_3$, ($0 \leq x \leq 1$), $PbTiO_3$, HfLaO, or a combination thereof.

13. The memory cell of claim 10, wherein a primary phase of the FE layer is an orthorhombic phase.

14. The memory cell of claim 13, wherein the orthorhombic phase represents from about 60 atomic percent (at %) to about 99.9 at % of the FE layer.

15. A method of forming a memory cell, comprising:
depositing a high-k dielectric layer over a substrate;
depositing a discontinuous seed structure comprising particles of a metal disposed on the high-k dielectric layer;
growing a ferroelectric (FE) layer on the seed structure and portions of the high-k dielectric layer exposed through the seed structure,
wherein the metal promotes the formation of an orthorhombic phase in the FE layer.

16. The method of claim 15, further comprising:
depositing a bottom electrode layer on the substrate under the high-k dielectric layer; and
depositing a top electrode layer on the FE layer.

17. The method of claim 16, wherein the depositing the seed structure comprises depositing from about ¼ to about ¾ of a mono-layer of metal atoms on the high-k dielectric layer.

18. The method of claim 16, further comprising patterning the top electrode, the FE layer, the high-k dielectric layer, and the bottom electrode to form a memory cell.

19. The method of claim 18, further comprising depositing an encapsulation layer on the memory cell.

20. The method of claim 19, further comprising depositing dielectric layer on the encapsulation layer.

* * * * *